(12) United States Patent
Chang et al.

(10) Patent No.: US 11,659,691 B2
(45) Date of Patent: May 23, 2023

(54) SERVER DEVICE

(71) Applicants: Inventec (Pudong) Technology Corporation, Shanghai (CN); INVENTEC CORPORATION, Taipei (TW)

(72) Inventors: Chun-Ming Chang, Taipei (TW); Tai-Jung Sung, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 65 days.

(21) Appl. No.: 17/474,129

(22) Filed: Sep. 14, 2021

(65) Prior Publication Data
US 2022/0394885 A1 Dec. 8, 2022

(30) Foreign Application Priority Data
Jun. 3, 2021 (CN) .......................... 202110617972.5

(51) Int. Cl.
*H05K 7/20* (2006.01)
*H05K 5/03* (2006.01)

(52) U.S. Cl.
CPC .......... *H05K 7/20718* (2013.01); *H05K 5/03* (2013.01); *H05K 7/20136* (2013.01); *H05K 7/20254* (2013.01); *H05K 7/20409* (2013.01); *H05K 7/20763* (2013.01)

(58) Field of Classification Search
CPC .......... H05K 7/20718; H05K 7/20254; H05K 7/20445; H05K 7/20409; H05K 7/20509; H05K 7/20136; H05K 7/20763; H05K 7/2039; H05K 5/03
See application file for complete search history.

(56) References Cited

U.S. PATENT DOCUMENTS

| | | | | |
|---|---|---|---|---|
| 5,684,676 A * | 11/1997 | Lin | ..................... | H01L 23/4093 174/16.3 |
| 6,480,387 B1 * | 11/2002 | Lee | ..................... | H01L 23/4006 24/453 |
| 6,483,707 B1 * | 11/2002 | Freuler | ............... | H01L 23/3737 428/209 |
| 9,226,415 B1 * | 12/2015 | Lin | ....................... | H05K 7/1487 |
| 10,721,842 B1 * | 7/2020 | Fathi | ................. | H05K 7/20809 |
| 2003/0062195 A1 * | 4/2003 | Arrigotti | ................ | H05K 3/308 228/180.1 |
| 2006/0227504 A1 * | 10/2006 | Chen | ................. | H05K 7/20909 361/679.52 |

(Continued)

*Primary Examiner* — Jacob R Crum
*Assistant Examiner* — Matthew Sinclair Muir
(74) *Attorney, Agent, or Firm* — Locke Lord LLP; Tim Tingkang Xia, Esq.

(57) ABSTRACT

A server device includes a casing, an electronic assembly, a cover, and a heat dissipation device. The electronic assembly includes a circuit board and at least one heat source. The circuit board is disposed on the casing, and the heat source is disposed on the circuit board. The cover is slidably disposed on the casing. The heat dissipation device includes at least one air cooling heat exchanger and at least one liquid cooling heat exchanger. The air cooling heat exchanger is fixed on and thermally coupled with the heat source. The liquid cooling heat exchanger is fixed on the cover and thermally coupled with the air cooling heat exchanger.

8 Claims, 6 Drawing Sheets

(56) References Cited

U.S. PATENT DOCUMENTS

| | | | |
|---|---|---|---|
| 2007/0146990 A1* | 6/2007 | Hsieh | G06F 1/20 |
| | | | 257/E23.09 |
| 2009/0213550 A1* | 8/2009 | Hongo | H05K 7/20509 |
| | | | 361/704 |
| 2010/0027220 A1* | 2/2010 | Hughes | H05K 7/2049 |
| | | | 361/702 |
| 2011/0061847 A1* | 3/2011 | Hsieh | H01L 23/4006 |
| | | | 165/185 |
| 2018/0283797 A1* | 10/2018 | Tochigi | F28D 15/0233 |
| 2019/0166724 A1* | 5/2019 | Moss | H05K 7/207 |
| 2021/0195795 A1* | 6/2021 | Ochiai | H05K 7/20772 |
| 2021/0274685 A1* | 9/2021 | Bhatia | H05K 7/20154 |
| 2022/0039294 A1* | 2/2022 | Chang | H05K 7/20727 |
| 2022/0304193 A1* | 9/2022 | Shearman | H05K 7/20336 |

* cited by examiner

SERVER DEVICE

CROSS-REFERENCE TO RELATED APPLICATIONS

This non-provisional application claims priority under 35 U.S.C. § 119(a) on Patent Application No(s). 202110617972.5 filed in China, on Jun. 3, 2021, the entire contents of which are hereby incorporated by reference.

BACKGROUND OF THE INVENTION

Technical Field of the Invention

The invention relates to a server device, more particular to a server device having a liquid cooling and an air cooling combined together.

Description of the Related Art

In the present, servers are widely used by enterprises. The servers are combined with the applications of the Internet and the telecommunication industry, and the servers can be applied in various fields, such as financial business, online bank business, online credit card business and artificial intelligence since the servers have a powerful performance. Take the artificial intelligence for example, the artificial intelligence requires a large amount of computing, such that the servers applied in the artificial intelligence should have powerful processors. However, the powerful processors may generate a large amount of waste heat. When the waste heat is unable to be efficiently removed, the performances of the processors may be reduced, or even the processors may be damaged.

In order to take waste heat out of the server, an open liquid cooling system is applied in the server. However, the arrangement of the tubes of the open liquid cooling system is too complex, and some of the tubes are required to be disposed between a storage device and a central processing unit. Moreover, it is difficult to arrange and install the tubes in the narrow interior space of the server.

SUMMARY OF THE INVENTION

The invention provides a server device which has a simplified arrangement of the liquid cooling system while increasing the heat dissipation efficiency.

One embodiment of the invention provides a server device. The server device includes a casing, an electronic assembly, a cover, and a heat dissipation device. The electronic assembly includes a circuit board and at least one heat source. The circuit board is disposed on the casing, and the heat source is disposed on the circuit board. The cover is slidably disposed on the casing. The heat dissipation device includes at least one air cooling heat exchanger and at least one liquid cooling heat exchanger. The air cooling heat exchanger is fixed on and thermally coupled with the heat source. The liquid cooling heat exchanger is fixed on the cover and thermally coupled with the air cooling heat exchanger.

According to the server device as discussed in the above embodiment, the tubes connected to the liquid cooling heat exchangers are fixed on the cover via the liquid cooling heat exchangers, such that the tubes can be prevented from occupying spaces on the circuit board used to arrange electronic components.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
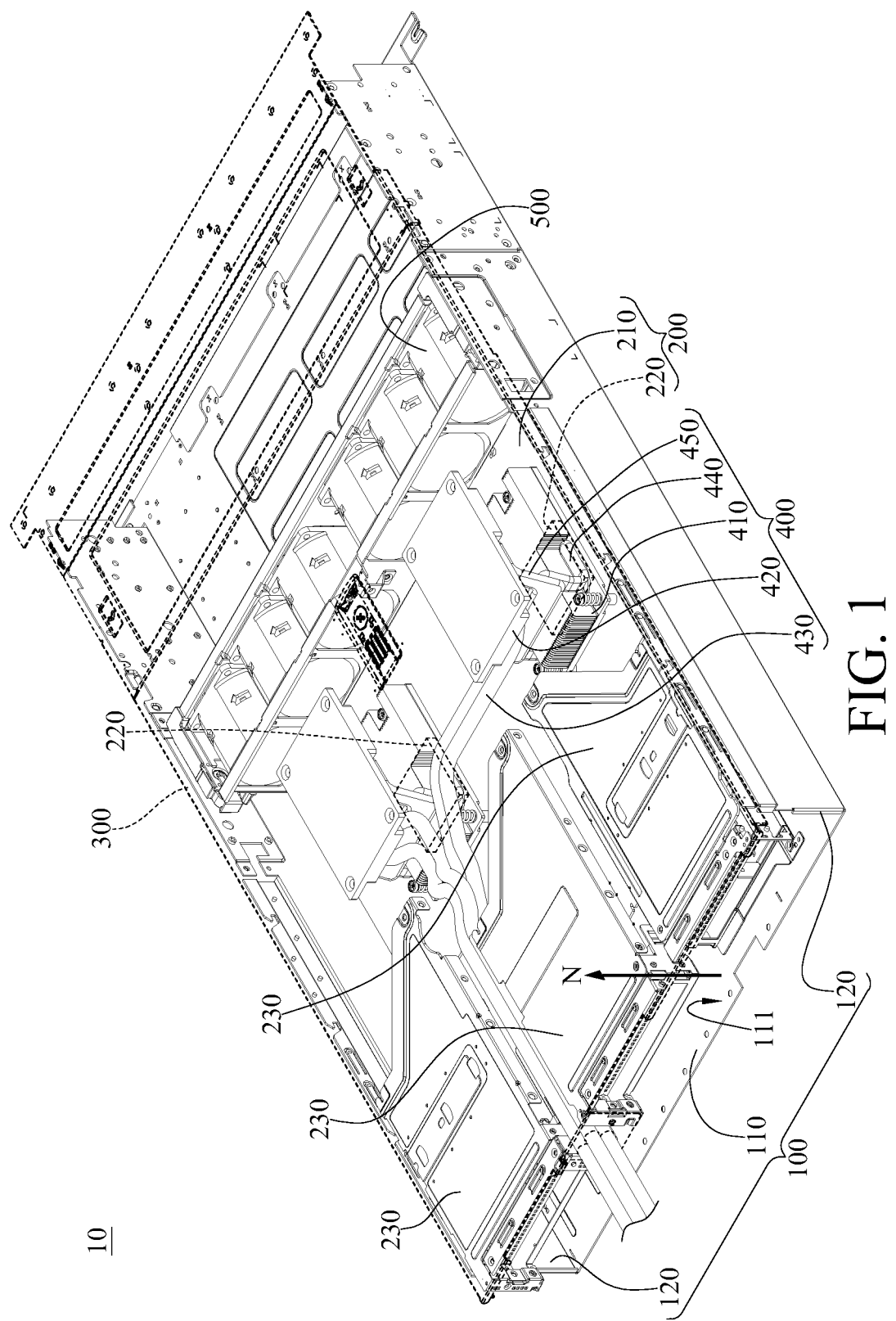
FIG. 1 is a perspective view of a server device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
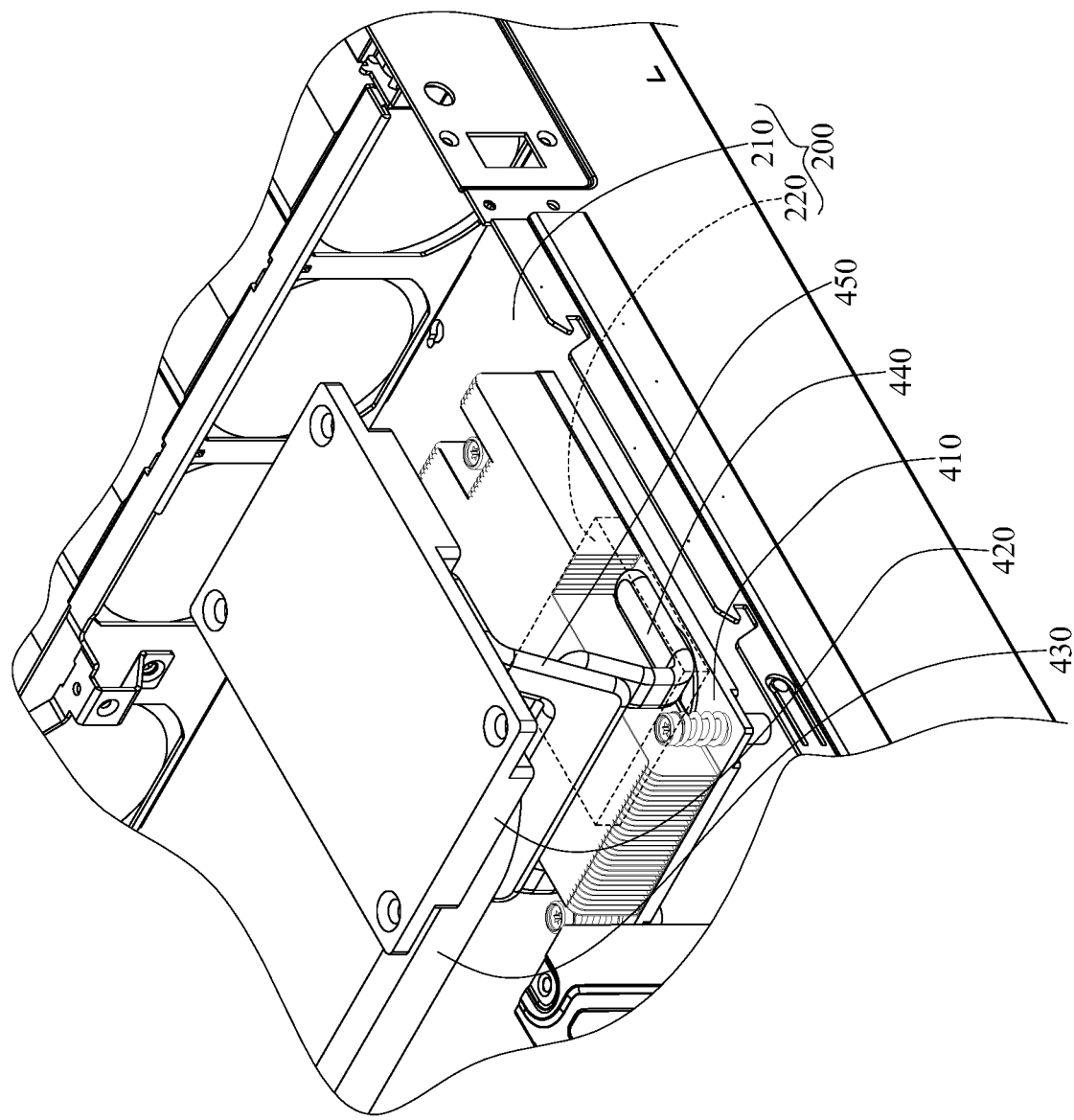
FIG. 2 is a partial perspective view of the server device in FIG. 1 when a cover is removed.
Figure 3:
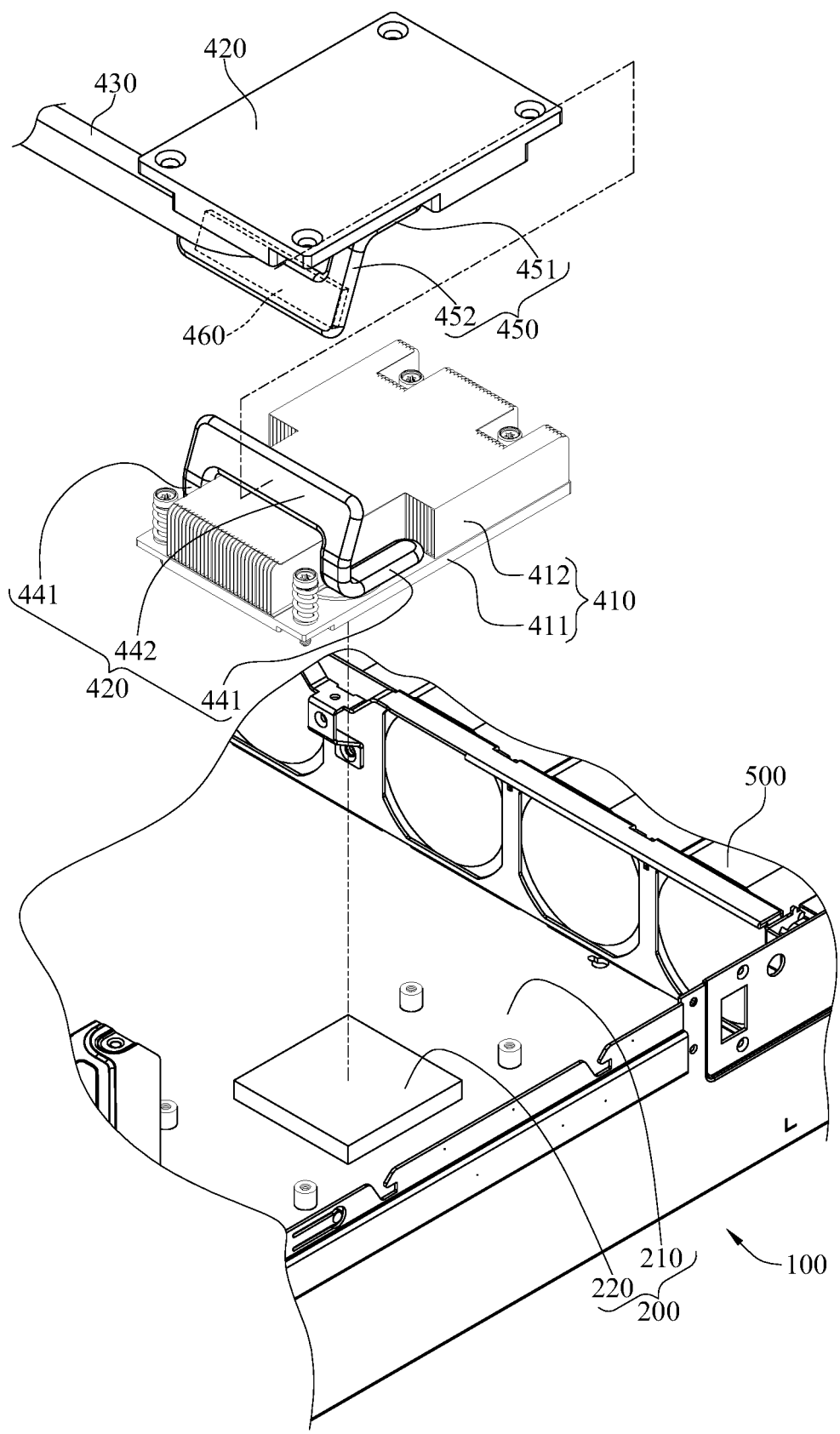
FIG. 3 is a partial exploded view of the server device in FIG. 2.
Figure 4:
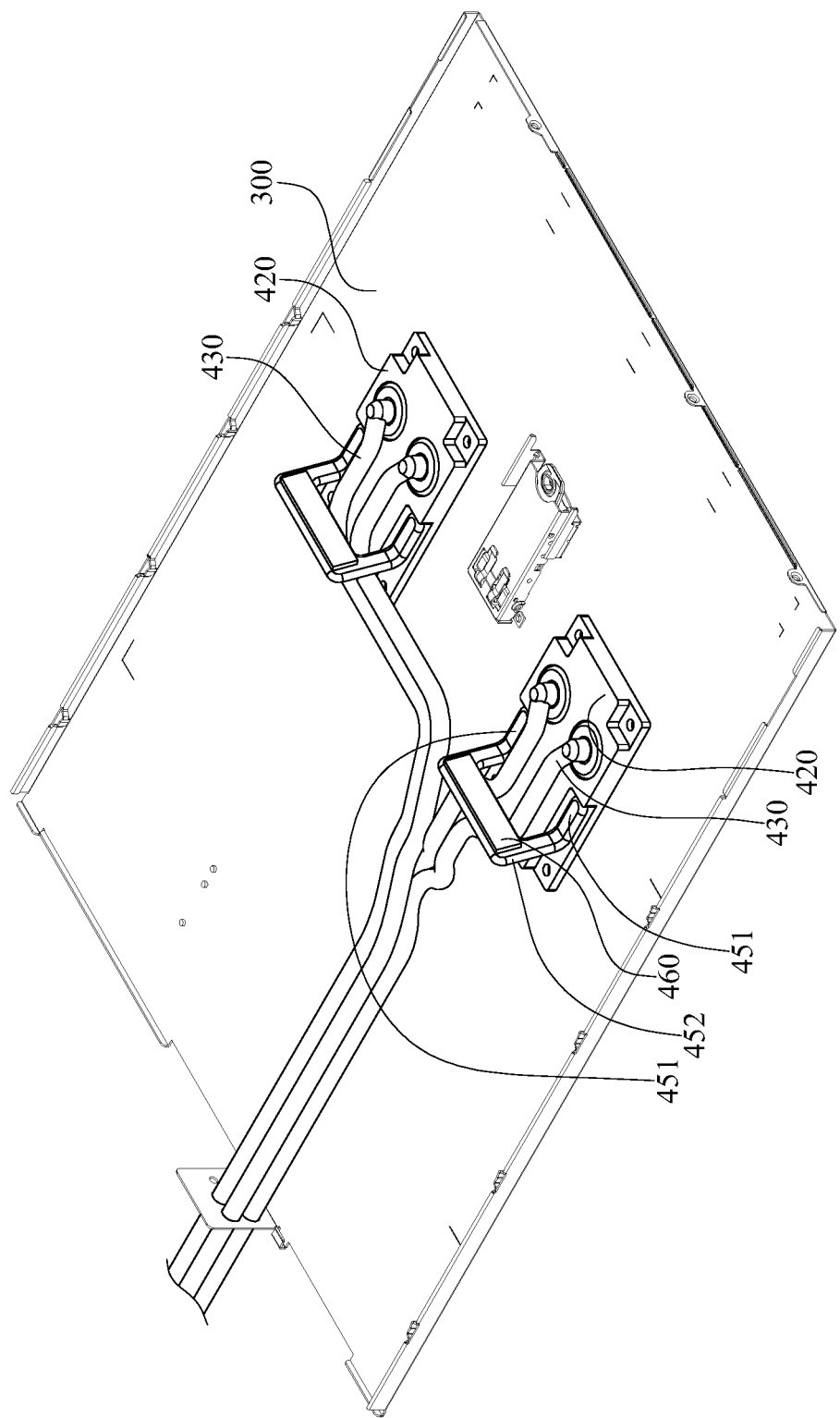
FIG. 4 is a perspective view of the cover of the server device in FIG. 1.

Referring to FIGS. 1 to 4, there are shown a perspective view of a server device 10 according to one embodiment of the invention, a partial perspective view of the server device 10 in FIG. 1 when a cover 300 is removed, a partial exploded view of the server device 10 in FIG. 2, and a perspective view of the cover 300 of the server device 10 in FIG. 1.

In this embodiment, the server device 10 is, for example, a server. The server device 10 includes a casing 100, an electronic assembly 200, a cover 300, and a heat dissipation device 400.

The casing 100 includes a bottom plate 110 and two side plates 120. The bottom plate 110 has a supporting surface 111. The side plates 120 are respectively connected to two opposite sides of the bottom plate 110 and extend along a normal line N of the supporting surface 111 of the bottom plate 110.

The electronic assembly 200 includes a circuit board 210 and two heat sources 220. The circuit board 210 is disposed on the casing 100. The heat sources 220 are, for example, central processing units. The heat sources 220 are disposed on the circuit board 210.

In this embodiment, the electronic assembly 200 may further include a plurality of expansion assemblies 230. The expansion assemblies 230 are, for example, interface card assemblies. The expansion assemblies 230 are disposed on the casing 100 and spaced apart from one another.

The cover 300 is slidably disposed on the side plates 120 of the casing 100. The cover 300 is slidable along a direction parallel to the bottom plate 110 of the casing 100;

that is, the cover 300 can be moved horizontally to cover on the casing 100.

The heat dissipation device 400 includes two air cooling heat exchangers 410 and two liquid cooling heat exchangers 420. The air cooling heat exchangers 410 are respectively fixed on and thermally coupled with the heat sources 220. Specifically, each of the air cooling heat exchangers 410 includes a base 411 and a plurality of fins 412. In each air cooling heat exchanger 410, the base 411 is fixed on the circuit board 210 via, for example, screws or a snap-fit means and in thermal contact with one of the heat sources 220, and the fins protrude from a surface of the base 411 facing away from the heat source 220.

The liquid cooling heat exchangers 420 are fixed on the cover 300 and are respectively and thermally coupled with the air cooling heat exchangers 410. Specifically, the heat dissipation device 400 further includes two first thermally conductive components 440, two second thermally conductive components 450, and two flexible thermally conductive pads 460. Each of the first thermally conductive components 440 includes two mount portions 441 and a contact portion 442, where the mount portions 441 are respectively connected to two opposite sides of the contact portion 442 and fixed on the base 411 of one air cooling heat exchanger 410, the mount portions 441 are in bent shapes, the contact portion 442 is in an inclined shape, and the mount portions 441, the contact portion 442, and the base 411 together surround a part of the fins 412 of the air cooling heat exchanger 410. Each of the second thermally conductive components 450 includes two mount portions 451 and a contact portion 452, where the mount portions 451 are respectively connected to two opposite sides of the contact portion 452 and fixed on one liquid cooling heat exchanger 420, the mount portions 451 are in bent shapes, and the contact portion 452 is in an inclined shape.

The flexible thermally conductive pads 460 are respectively stacked on the contact portions 452 of the second thermally conductive components 450. The air cooling heat exchangers 410 are respectively and thermally coupled with the liquid cooling heat exchangers 420 via the first thermally conductive components 440, the second thermally conductive components 450, and the flexible thermally conductive pads 460.

In this embodiment, the heat dissipation device 400 may further include a plurality of tubes 430. The tubes 430 are integrally mounted on the liquid cooling heat exchangers 420. The tubes 430 extend outside the casing 100 from a gap between adjacent two expansion assemblies 230, such that junctions of the tubes 430 and exterior tubes (not shown) are located outside the casing 100. Therefore, the leakage occurring at the junctions will not cause an electrical short circuit of the electronic assembly 200. In addition, the tubes 430 are partially located in the gap between the expansion assemblies 230, such that the tubes 430 are prevented from interfering with cables connected to the expansion assemblies 230, thereby facilitating the management of the cables.

In this embodiment, the tubes 430 are fixed on the cover 300 via the liquid cooling heat exchangers 420, such that the tubes 430 can be moved along with the cover 300 and prevented from occupying spaces on the circuit board 210 used to arrange electronic components. Note that the positions of the tubes 430 may be modified as required; in some other embodiments, the tubes may be fixed on the casing.

In this embodiment, the server device 10 may further include a plurality of airflow generators 500. The airflow generators 500 are disposed on the casing 100. The airflow generators 500 are configured to generate airflows towards the air cooling heat exchangers 410 to increase the heat exchange efficiency between the air cooling heat exchangers 410 and air in the server device 10.

Note that the quantities of the heat sources 220, the air cooling heat exchangers 410, the liquid cooling heat exchangers 420, the first thermally conductive components 440, the second thermally conductive components 450, and the flexible thermally conductive pads 460 are not restricted, and the quantity of each of them may be modified to be one in some other embodiments.

Note that the quantity of the airflow generators 500 is not restricted, and the quantity of the airflow generator may be modified to be one in some other embodiments.

Figure 5:
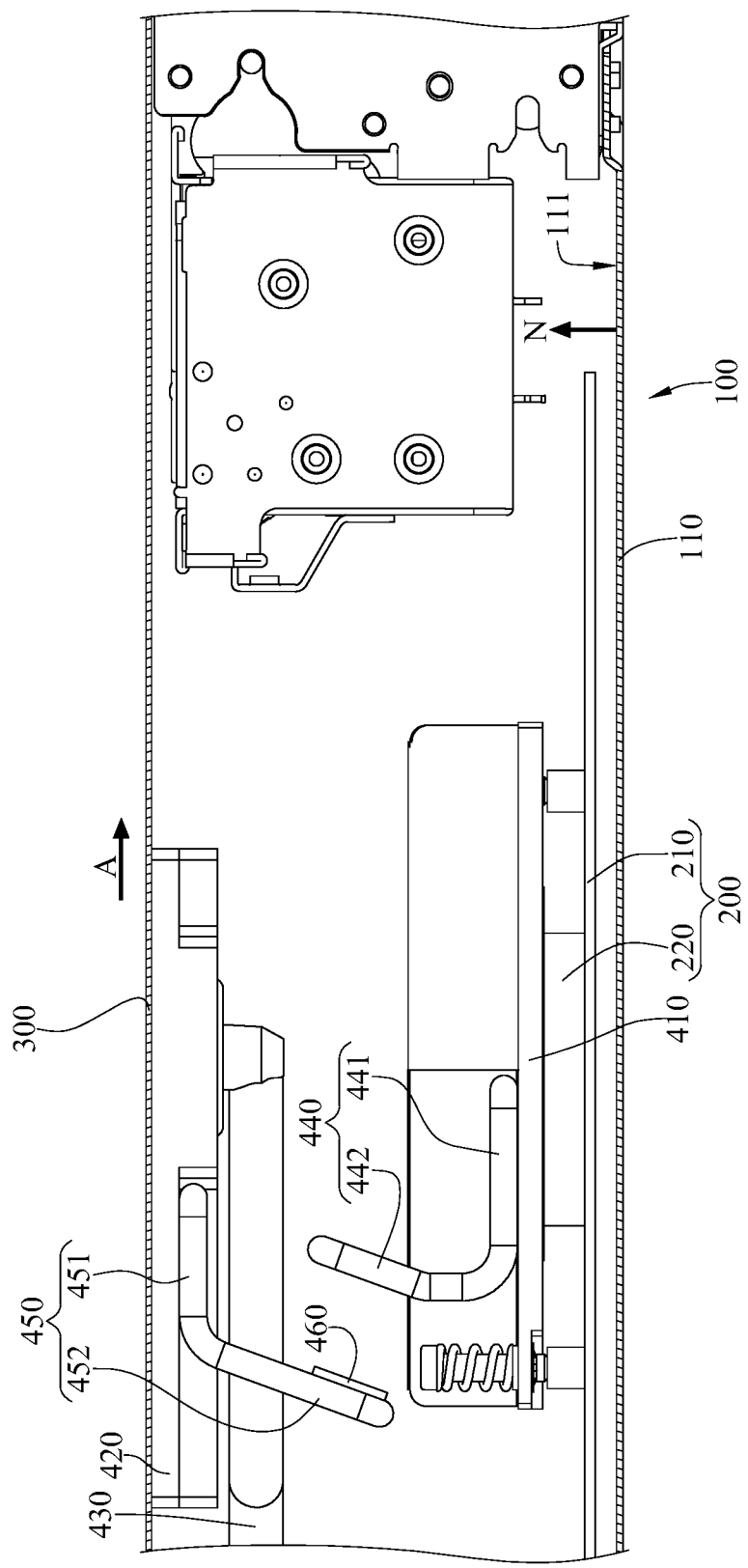
FIG. 5 shows an installation of the cover of the server device in FIG. 1.
Figure 6:
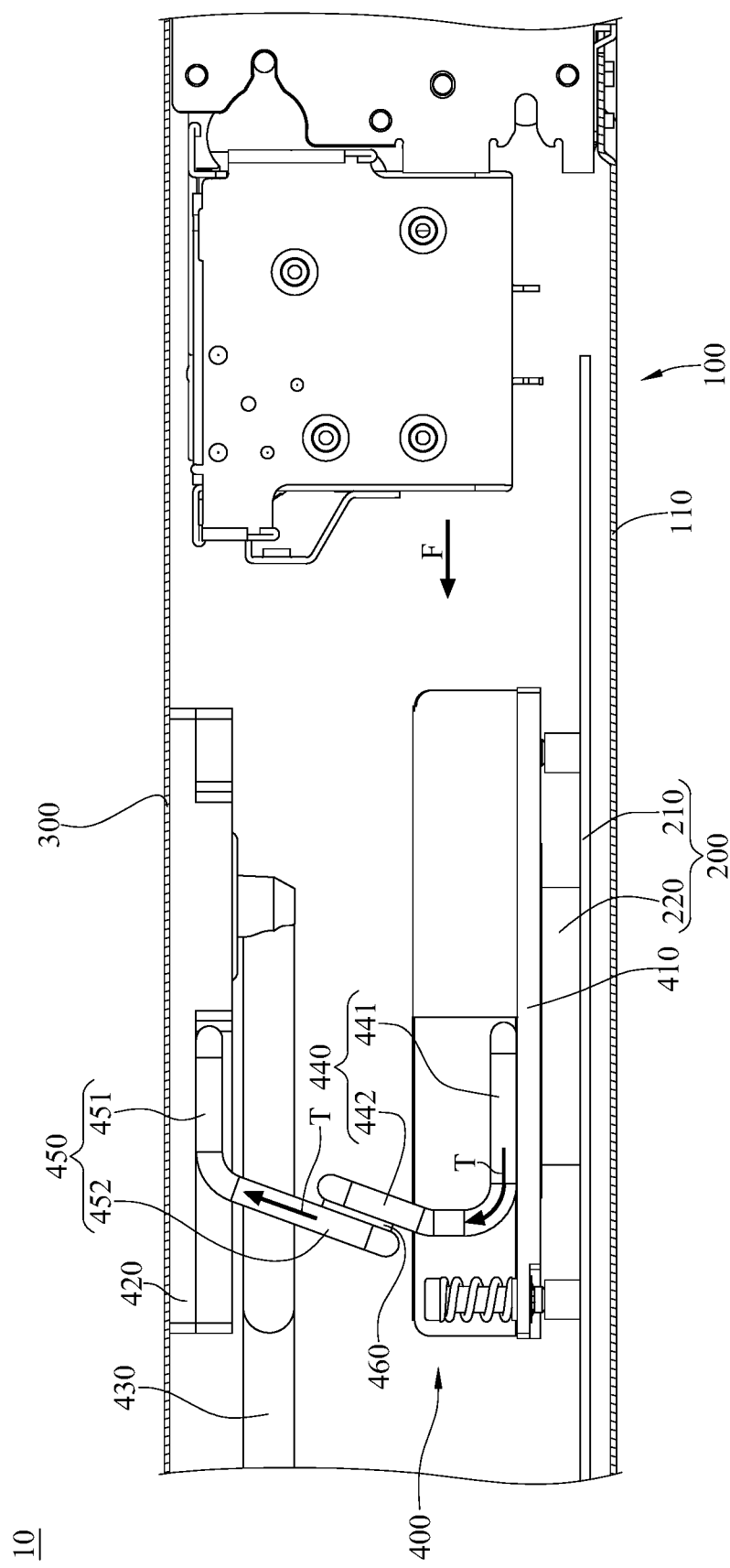
FIG. 6 is a partial cross-sectional view of the server device in FIG. 1.

Then, referring to FIGS. 5 and 6, FIG. 5 shows an installation of the cover 300 of the server device 10 in FIG. 1, and FIG. 6 is a partial cross-sectional view of the server device 10 in FIG. 1.

After interior components of the server device 10 are installed in the casing 100, the cover 300 can be mounted on the side plates 120 and moved in a direction A perpendicular to the normal line N of the supporting surface 111 of the bottom plate 110, such that the liquid cooling heat exchangers 420 are respectively and thermally coupled with the air cooling heat exchangers 410 via the flexible thermally conductive pads 460, the first thermally conductive components 440, and the second thermally conductive components 450. When the server device 10 is in operation, the airflow generators 500 generate the airflows (e.g., along the direction F) towards the air cooling heat exchangers 410 to take heat generated by the heat sources 220 away. At the same time, heat generated by the heat sources 220 can be conducted to the liquid cooling heat exchangers 420 via the first thermally conductive components 440, the second thermally conductive components 450, and the flexible thermally conductive pads 460 along a direction T, such that heat can be taken to outside of the server device 10 via the tubes 430. Therefore, the server device 10 can use the air cooling manner and the liquid cooling manner to dissipate heat at the same time so as to increase the heat dissipation efficiency. Additionally, the heat dissipation devices 400 are simple in structure, such that the heat dissipation devices 400 can be easily applied in conventional servers.

According to the server device as discussed in the above embodiment, the tubes connected to the liquid cooling heat exchangers are fixed on the cover via the liquid cooling heat exchangers, such that the tubes can be prevented from occupying spaces on the circuit board used to arrange electronic components.

In addition, the tubes are partially located in the gap between the expansion assemblies, such that the tubes are prevented from interfering with cables connected to the expansion assemblies and the arrangements of the input/output interfaces of the expansion assemblies, thereby facilitating the management of the cables.

Furthermore, the tubes are integrally mounted on the liquid cooling heat exchangers, and the tubes extend outside the casing from the gap between the expansion assemblies, such that junctions of the tubes and exterior tubes (not shown) are located outside the casing. Therefore, the leakage occurring at the junctions will not cause an electrical short circuit of the electronic assembly.

In one embodiment, the server device (i.e., electronic device) disclosed by the invention can be applied to artificial intelligence (AI) computing, edge computing and can be used as 5G server device, cloud computing server device, or internet of vehicle server device.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server device, comprising:
   a casing;
   an electronic assembly, comprising a circuit board and at least one heat source, wherein the circuit board is disposed on the casing, and the at least one heat source is disposed on the circuit board;
   a cover, slidably disposed on the casing; and
   a heat dissipation device, comprising:
      at least one air cooling heat exchanger, fixed on and thermally coupled with the at least one heat source, wherein the at least one air cooling heat exchanger comprises a base and a plurality of fins;
      at least one liquid cooling heat exchanger, fixed on the cover;
   wherein the heat dissipation device further comprises at least one first thermally conductive component and at least one second thermally conductive component, the at least one second thermally conductive component is fixed on the at least one liquid cooling heat exchanger, and the at least one air cooling heat exchanger is thermally coupled with the at least one liquid cooling heat exchanger via the at least one first thermally conductive component and the at least one second thermally conductive component; and
   wherein each of the at least one first thermally conductive component and the at least one second thermally conductive component comprises two mount portions and a contact portion, the mount portions of the at least one first thermally conductive component are fixed on the base and connected to two opposite sides of the contact portion of the at least one first thermally conductive component, the contact portion and the mount portions of the at least one first thermally conductive component and the base together surround a part of the plurality of fins, the mount portions of the at least one second thermally conductive component are fixed on the at least one liquid cooling heat exchanger and connected to two opposite sides of the contact portion of the at least one second thermally conductive component, and the contact portion of the at least one second thermally conductive component is thermally coupled with the contact portion of the at least one first thermally conductive component.

2. The server device according to claim 1, wherein the casing comprises a bottom plate and two side plates, the side plates are respectively connected to two opposite sides of the bottom plate, and the cover is slidably disposed on the side plates.

3. The server device according to claim 1, wherein the base is in thermal contact with the at least one heat source, and the plurality of fins protrude from a surface of the base facing away from the at least one heat source.

4. The server device according to claim 1, further comprising at least one flexible thermally conductive pad disposed on the at least one second thermally conductive component, wherein the at least one liquid cooling heat exchanger is thermally coupled with the at least one air cooling heat exchanger via the at least one flexible thermally conductive pad, the at least one second thermally conductive component, and the at least one first thermally conductive component.

5. The server device according to claim 1, wherein the heat dissipation device further comprises at least one tube, and the at least one tube is integrally mounted on the at least one liquid cooling heat exchanger.

6. The server device according to claim 5, wherein the electronic assembly further comprises two expansion assemblies disposed on the casing, and the at least one tube extends outside the casing from a gap between the expansion assemblies.

7. The server device according to claim 5, wherein the at least one tube is fixed on the cover.

8. The server device according to claim 1, further comprising an airflow generator, wherein the airflow generator is disposed on the casing, and the airflow generator is configured to generate an airflow towards the at least one air cooling heat exchanger.

* * * * *